US009046761B2

(12) United States Patent
Ogadhoh et al.

(10) Patent No.: US 9,046,761 B2
(45) Date of Patent: Jun. 2, 2015

(54) LITHOGRAPHY MASK HAVING SUB-RESOLUTION PHASED ASSIST FEATURES

(71) Applicant: Intel Corporation, Santa Clara, CA (US)

(72) Inventors: Shem O. Ogadhoh, Beaverton, OR (US); Charles H. Wallace, Portland, OR (US); Ryan Pearman, San Jose, CA (US); Sven Henrichs, San Jose, CA (US); Arvind Sundaramurthy, Melno Park, CA (US); Swaminathan Sivakumar, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 121 days.

(21) Appl. No.: 13/846,319

(22) Filed: Mar. 18, 2013

(65) Prior Publication Data

US 2013/0216941 A1    Aug. 22, 2013

Related U.S. Application Data

(63) Continuation-in-part of application No. 12/977,813, filed on Dec. 23, 2010, now Pat. No. 8,399,157, and a continuation-in-part of application No. PCT/US2011/067924, filed on Dec. 29, 2011.

(51) Int. Cl.
*G03F 1/36* (2012.01)
*G03F 1/00* (2012.01)
*G03F 1/26* (2012.01)

(52) U.S. Cl.
CPC .. *G03F 1/00* (2013.01); *G03F 1/26* (2013.01); *G03F 1/36* (2013.01)

(58) Field of Classification Search
CPC ........................................................ G03F 1/36

USPC .................. 430/5, 322, 323, 394; 716/50–56
See application file for complete search history.

(56) References Cited

U.S. PATENT DOCUMENTS

| 5,858,580 | A  | 1/1999  | Wang et al.   |
|-----------|----|---------|---------------|
| 7,470,492 | B2 | 12/2008 | Bigwood et al.|

(Continued)

FOREIGN PATENT DOCUMENTS

WO     2013/101103 A1     7/2013

OTHER PUBLICATIONS

International Search Report and Written Opinion received for PCT Application No. PCT/US2011/067924, mailed on Sep. 27, 2012, 11 pages.

(Continued)

*Primary Examiner* — Stephen Rosasco
(74) *Attorney, Agent, or Firm* — Finch & Maloney PLLC

(57) ABSTRACT

Techniques are disclosed for using sub-resolution phased assist features (SPAF) in a lithography mask to improve through process pattern fidelity and/or mitigate inverted aerial image problems. The technique also may be used to improve image contrast in non-inverted weak image sites. The use of SPAF in accordance with some such embodiments requires no adjustment to existing design rules, although adjustments can be made to enable compliance with mask inspection constraints. The use of SPAF also does not require changing existing fab or manufacturing processes, especially if such processes already comprehend phased shift mask capabilities. The SPAFs can be used to enhance aerial image contrast, without the SPAFs themselves printing. In addition, the SPAF phase etch depth can be optimized so as to make adjustments to a given predicted printed feature critical dimension.

25 Claims, 10 Drawing Sheets

(56) References Cited

U.S. PATENT DOCUMENTS

| | | |
|---|---|---|
| 7,585,595 B2 | 9/2009 | Pierrat |
| 7,659,042 B2 | 2/2010 | Pierrat |
| 8,399,157 B2 | 3/2013 | Ogadhoh |
| 2006/0046160 A1 | 3/2006 | Wallace et al. |
| 2007/0031737 A1 | 2/2007 | Schroeder et al. |
| 2007/0184355 A1 | 8/2007 | Wallace et al. |
| 2008/0199784 A1 | 8/2008 | Sarma et al. |
| 2010/0180251 A1 | 7/2010 | Ye et al. |

OTHER PUBLICATIONS

Li et al., "Sub-resolution Assist Feature Modeling for Modern Photolithography Process Simulation", Japanese Journal of Applied Physics, vol. 47, Issue No. 6, Jun. 20, 2008, pp. 4862-4865.

International Preliminary Report on Patentability received for PCT Patent Application No. PCT/US2011/067924, mailed on Jul. 10, 2014, 8 Pages.

Final Etched SPAF

LITHOGRAPHY MASK HAVING SUB-RESOLUTION PHASED ASSIST FEATURES

RELATED APPLICATIONS

This application is a continuation-in-part of International Application PCT/US2011/067924 with an international filing date of Dec. 29, 2011. This application is also a continuation-in-part of U.S. application Ser. No. 12/977,813 filed Dec. 23, 2010. Both of these applications are hereby incorporated by reference herein.

BACKGROUND

As is known, lithography is commonly used when manufacturing integrated circuits. The process generally includes forming a photoresist layer on the surface of a semiconductor wafer, and then positioning a mask over the resist-coated wafer. The mask typically has light non-transmissive (opaque) regions of chrome and light transmissive (transparent) regions of quartz. Radiation from a light source (e.g., ultra-violet or deep ultra-violet light, etc) and focused via an optical lens system is then applied to the mask. The light passes through the transparent mask regions and exposes the underlying photoresist layer, and is blocked by the opaque mask regions to leave those underlying portions of photoresist layer unexposed. Depending on the specific process used, either the exposed or non-exposed regions of photoresist layer can then be removed, thereby leaving a patterned resist layer on the wafer, which in turn allows for subsequent processing of the wafer such as, for example, etching, depositing, and other typical semiconductor processes.

One conventional technique that enables smaller minimum device dimensions with relatively good contrast is generally referred to as alternating phase shift masking (APSM). APSM exploits the destructive interference caused by light passing through two adjacent transparent mask areas to create an unexposed area on the photoresist layer. In short, the phase of the light wave passing through and exiting the transparent mask regions is a function of the mask thickness, so mask thickness of adjacent mask regions can be selectively varied, such that the light exiting from those adjacent regions is out-of-phase which causes destructive interference (e.g., where light waves exiting from one adjacent area have a phase that is out-of-phase with the phase of light waves exiting from the other adjacent area, and the waves therefore cancel one another or otherwise yield a combined wave of diminished amplitude). Since the photoresist material is responsive to the intensity of the light, an unexposed area will be formed on the photoresist layer where the transparent regions of differing thicknesses are adjacent.

BRIEF DESCRIPTION OF THE DRAWINGS

FIG. 1b illustrates a corresponding intensity plot of the slice shown in FIG. 1a.

DETAILED DESCRIPTION

Techniques are disclosed for using sub-resolution phased assist features (SPAF) in a lithography mask to improve through process pattern fidelity and/or mitigate inverted aerial image problems. The technique also may be used to improve image contrast in non-inverted weak image sites. The use of SPAF in accordance with some such embodiments requires no adjustment to existing design rules, even though such adjustment could be made to account for any mask manufacturing inspectability constraints, if so desired. It also does not require changing existing fab or manufacturing processes if such process are already designed to comprehend use of phase shift masking (PSM) technologies. The SPAFs can be used to enhance aerial image contrast, without the SPAFs themselves printing. In addition, the SPAF phase etch depth can be optimized so as to make adjustments to a given predicted printed feature critical dimension.

General Overview

As is known, the smallest feature size or critical dimension (CD) that can be patterned using a given optical lens system is inversely proportional to the numerical aperture (NA) of the lens system, $$CD = K_1 \frac{\lambda}{NA}.$$

For a given design pitch and process, the optimal NA is normally preselected. Depending on the technology node, the preselected numerical aperture is often the largest available, and the wavelength of light λ used is often the smallest available. Given these parameters, the $K_1$ factor is often regarded as a measure of how difficult it is to pattern features of the indicated critical dimension. A combination of resist selection and complex optical proximity correction (OPC) or resolution enhancement technologies (RET) can be used to ensure that all the patterns in the integrated circuit design layout are sufficiently in focus in order to reproduce the patterns on wafer with good pattern fidelity. However, a general trend is that the scanner technology has not progressed fast enough to keep up with the scaling of critical dimension of the patterns needed to create state-of-the-art circuits. Since a conventional patterning process is typically done in layers, the surface at each step is often topographically not perfectly planar. Given the large numerical aperture, the depth range in a non-planar surface over which the features are in acceptable focus is often very small. Also, given that the critical dimension is significantly smaller than $\lambda$, achieving acceptable contrast for the features in the layout can be extremely challenging. In this sense, limitations on conventional lithography processes effectively limit the minimum realizable dimensions of circuitry being formed on the wafer.

Figure 1A:
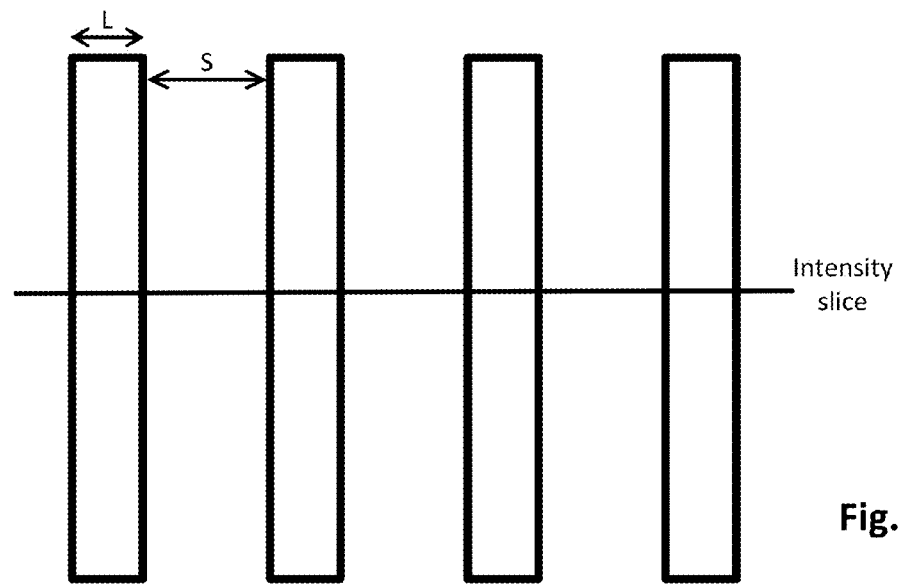
FIG. 1a schematically illustrates an example feature pattern.
Figure 1B:
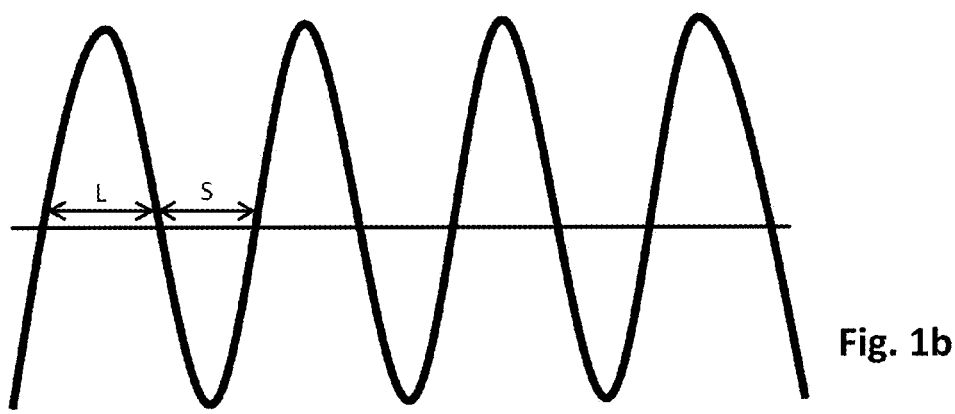

Consider, for instance, for a given feature pattern such as the example one shown schematically in FIG. 1a, an intensity plot drawn of a slice across the feature will show maxima at the point of highest intensity and minima at the points of lowest intensity. The corresponding intensity plot of the slice shown in FIG. 1a is shown in FIG. 1b. A point of highest intensity, for a proper pattern, generally corresponds to a region in the mask that has the highest transmittance. A binary system, for instance, will have 100% transmittance at the peaks and 0% transmittance in between. The delta between the maxima and the minima is a measure of contrast, with higher contrast being desirable.

Figure 1C:
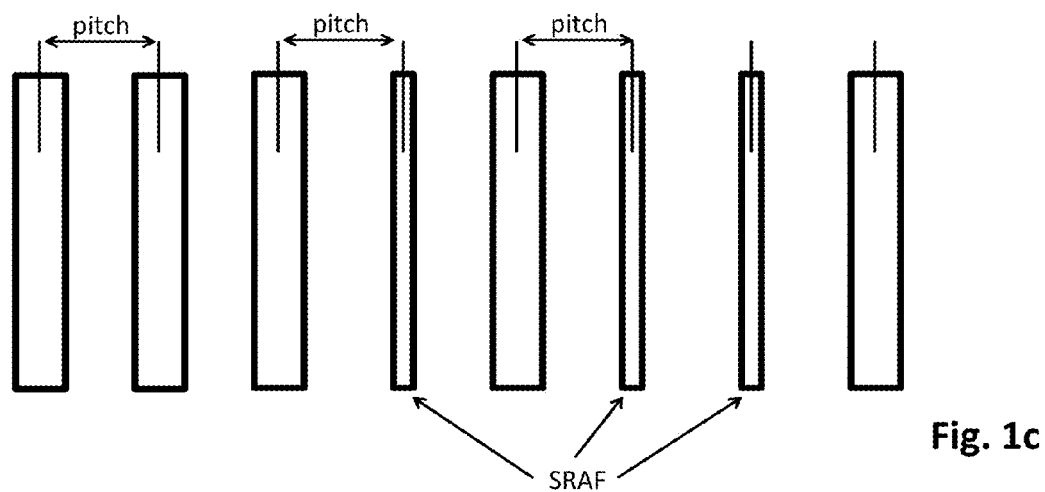
FIG. 1c illustrates an example layout design configured with conventional sub-resolution assist features (SRAFs).

For a given layout design, such as the example one shown in FIG. 1c, the patterning process may be optimal at a given pitch. As can be seen, this example layout includes features having a dimension L (e.g., resist line width) and spaces of distance S between those features. In an optimal state, L and S have the smallest error deviations from desirable values, at both the nominal process conditions and the off-focus conditions. However, if either L or S is changed relative to the other thereby decreasing/increasing the pitch, the contrast as well as the feature size will start to deviate from the desirable values. One measure of the deviation from the desirable feature size is often the delta between the dimensions at the off-focus conditions from those at nominal conditions. At its most desirable state, a process could theoretically be optimized such that the critical dimension at nominal conditions is the same as the critical dimension at off-focus conditions for a given defocus range. Such an ideal system would have infinite focus window over that range of defocus, which is generally atypical. Rather, for most practical systems, a line critical dimension will decrease at off-focus conditions if the pitch is increased by increasing the space. If at some larger space a line can be inserted such that the small critical dimension delta from nominal to off-focus conditions are recaptured by recovering some of the behavior at the optimal pitch, then the inserted feature would have to be one that does not print. If it printed, it would insert a feature that was not in the original and this would be undesirable.

These so-called assist features enable the recovery of focus window by a phenomenon known as constructive interference. Because they themselves do not print or resolve on wafer, they are said to be sub-resolution. Hence their name sub-resolution assist feature (SRAF). In order to enable this constructive interference behavior, SRAFs need to be the same polarity as the main feature. For instance, if the main feature is glass (100% transmittance), then the SRAF will also need to be glass. In addition, conventional SRAFs are also the same phase as the main feature (same thickness). FIG. 1c further illustrates example SRAFs to maintain pitch with main features.

Figure 2A:
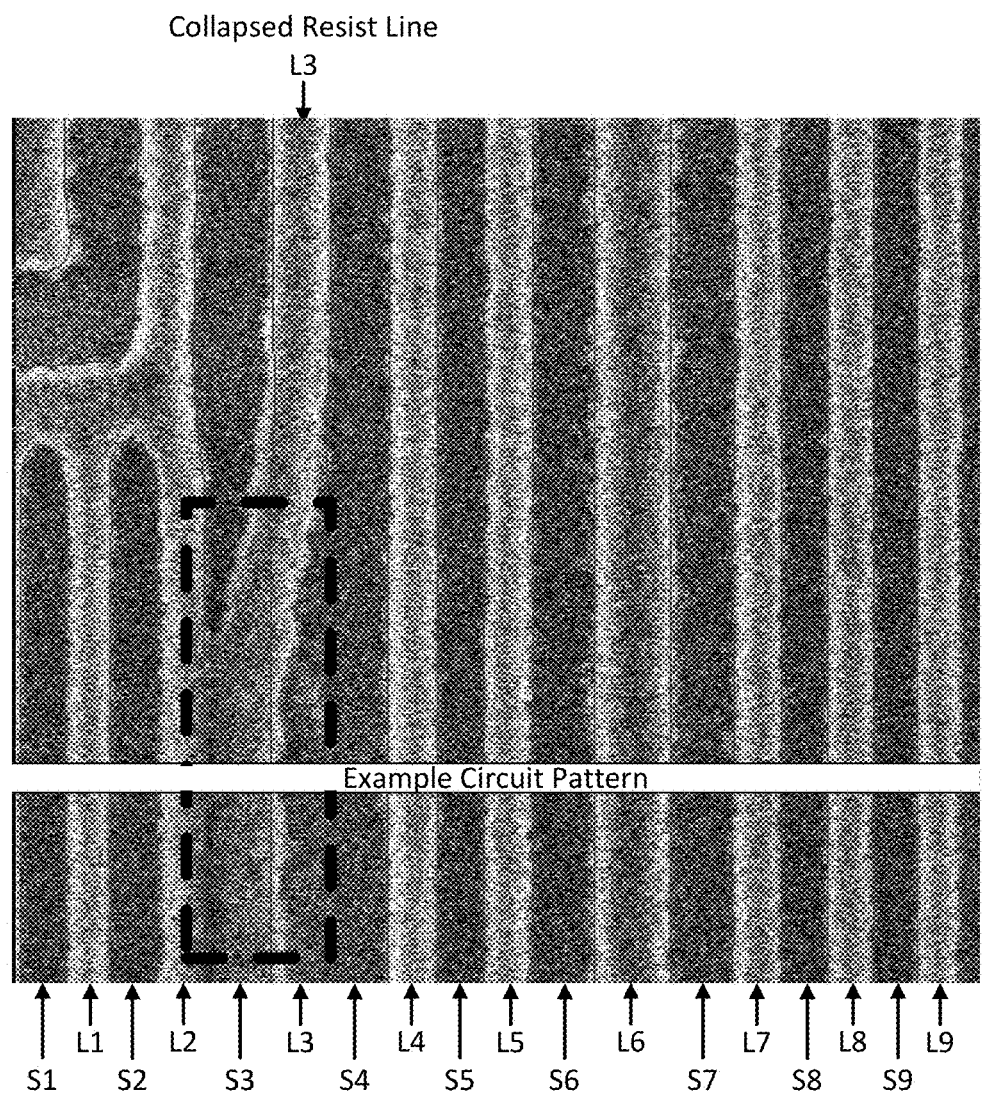
FIG. 2a is scanning electron microscope (SEM) image of a patterned wafer exhibiting a collapsed resist line due to image inversion resulting from a conventional mask.
Figure 2B:
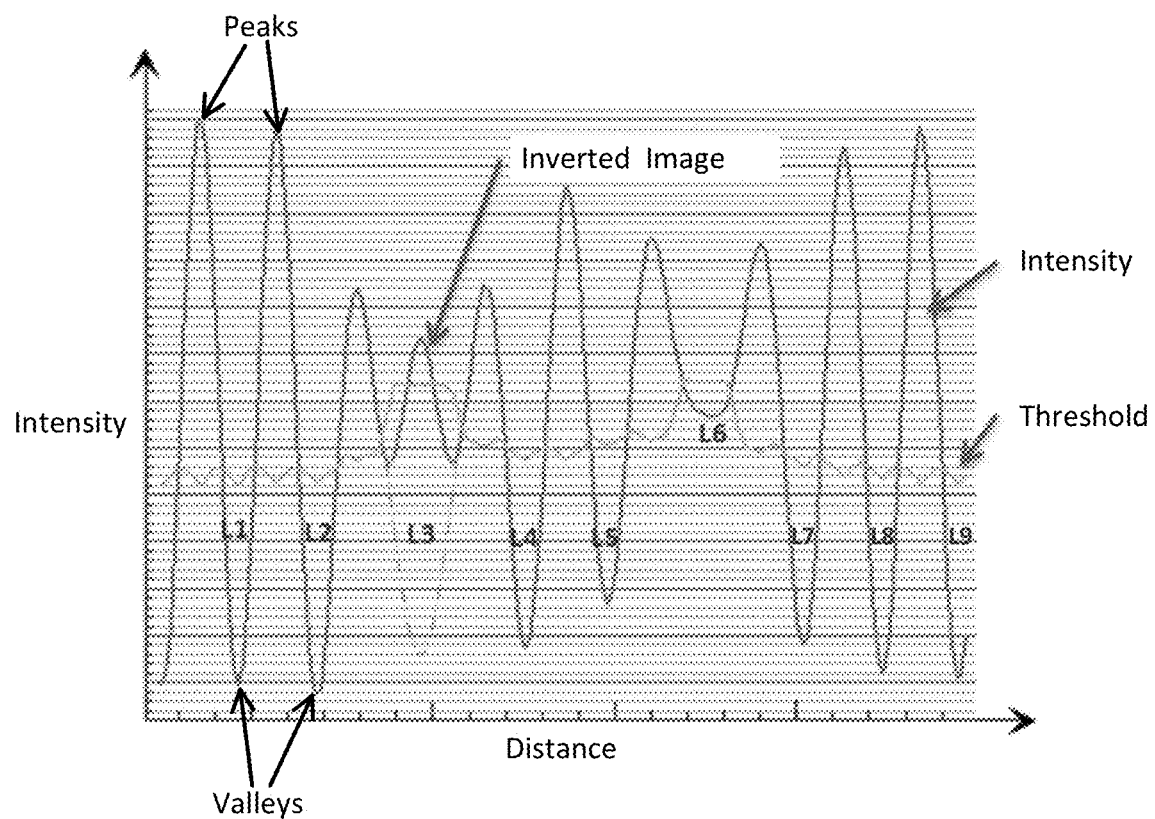
FIG. 2b is the corresponding intensity plot of that mask, which shows severe inversion of the resist line along with a dotted line to show the expected trend for a well-behaved system.

There remain, however, a number of unresolved and non-trivial limitations associated with scaling minimum feature sizes of semiconductor devices. For instance, conventional dual mask double patterning approaches can be used, but carry a significant process cost. Similarly, global use of alternating phase shift techniques or uni-directional interconnect routing increase the number of layers and therefore complicate the manufacturing process and exacerbate topography related issues. In addition, non-maximum wide lines with lower resistivity and capacitance are generally used to enable power transmission over longer distances in integrated circuits. Transitioning from these wide lines to minimum critical dimension narrow lines can result in pitch combinations that cannot be patterned with acceptable fidelity using conventional lithography. Often these lines which are useful for resistance-capacitance (RC) tuning, if of intermediate critical dimension, cannot pattern with acceptable process window if drawn isolated. Using design rules to restrict the spaces, as conventionally done, often requires tracks to be consumed with the requisite dummy lines which then results in die foot print impact (i.e., larger die). Increasing or otherwise altering the line dimension often results in sub-optimal resistance-capacitance (RC). In addition, there are pitches at which intermediate lines induce image inversion in the adjacent spaces (resist line collapse). This problem is unrecognized by conventional techniques and is best illustrated in FIGS. 2a-b, which shows an image of pattern failure resulting from image inversion and will be discussed in further detail below. Given the size ranges involved, conventional correction techniques cannot be used to mitigate such fallen line marginalities.

In accordance with an embodiment of the present invention, one or more sub-resolution phased assist features (SPAF) are used to improve contrast in geometries that have very marginal aerial images and images that have good aerial image contrast at nominal z-depth but that are prone to inverted aerial image at lower z-depth thus causing resist line collapse. In one such example embodiment, destructive interference is used to lower the aerial image intensity in spaces whose intensity cannot be lowered by line upsizing due to the image inversion that would occur. Aerial image inversion is a phenomenon that, at certain pitches, results in a double minima in intensity plots in a wide space and a maxima that has a peak intensity above or close to printing threshold. This causes the collapse of lines that when observed by metrics that drive correction are predicted to be viable. In accordance with an embodiment, the application of sub-resolution phased assist features is used to eliminate the image inversion phenomenon. In contrast to conventional methodologies, the SPAFs provided herein can be used to not only enable improved aerial image contrast, but also to improve through focus performance without a significant increase in line critical dimension at nominal patterning conditions, in accordance with various example embodiments.

Thus, the techniques described herein can be used to improve through focus pattern fidelity without changing the line dimensions in a manner that de-tunes RC, and/or resolve image inversion. Such example embodiments do not require restrictive design rules, which can significantly impact the die foot print as well as implicate substantial cycle time delays. The techniques can be embodied, for example, in lithography masks as well as in test systems and design/debug tools that employ those masks in the development and/or manufacturing of semiconductor devices.

Resist Line Collapse and Image Inversion

The degradation in focus window as the pitch increases as previously described will generally result in the failure of the smallest features first. The smallest feature can be, for example, a narrow space between two wide lines or a narrow line between two wide spaces. Depending on resist type, the spaces can be resist lines. Space failure can take the form, for instance, of a gradual top loss or fallen/collapsed resist lines. In the SEM image of the example patterned wafer shown in FIG. 2a, the resist lines are designated L1 through L9, and the resist spaces (no resist) are designated S1 through S9. The minima corresponding to the resist lines L1-L9 are shown in the intensity plot of FIG. 2b, with those minima also being labeled L1 through L9.

The pattern has been applied to the wafer using a conventional lithography system and techniques. The system can be, for example, a 193-nm step-and-scan exposure platform, but other exposure tools of varying capabilities will be apparent. This example pattern can be, for instance, a circuit fabricated using 22 nm or 32 nm node technologies, or any process technology having minimum feature sizes susceptible to image inversion and/or non-inverted weak image sites as described herein. In such cases, the small feature dimensions (e.g., width of conductor lines to be printed) are typically much smaller than the wavelength $\lambda$ of the light source used by the lithography system (e.g., 193 nm). Note the collapsed resist line R3 in the dashed box area, which yields short-circuited or otherwise misprinted conductors. This unexpected failure is generally due to image inversion and/or poor aerial image contrast, as will be further discussed with reference to FIG. 2b.

The SEM image of FIG. 2a shows that resist line L3 has fallen into the resist trench (or space) to its left. Where the resist line falls in such a failure mode is random. In other cases, for instance, the resist line may completely lift off and/or fall elsewhere. Further note in this example that resist line L6 has severe top loss, as generally indicated by its darker color relative to the other lighter resist lines. The intensity plot shown in FIG. 2b reflects data collected at a z-depth lower than the nominal z-depth. At such lower z-depths, it can be observed that resist line L3 shows a peak which should not be present as it corresponds to an opaque (e.g., chrome) line or space in the mask of this example. The phenomenon in which a space shows a local maxima is referred to as image inversion. The inversion can take the form of a well-formed peak (as is the case with resist line L3 in this example), or the form of a shallower minima (as is the case with resist line L6 in this example). Resist line L6 can be, for instance, the result of local minima and local maxima within the same space being of approximately the same intensity. Because this problem can occur in a resist line that is generally relatively wider compared to its neighbors, the problem cannot be mitigated using conventional SRAF as this would further enhance the peak due to constructive interference.

As will be appreciated in light of this disclosure, the x-axis of the intensity plot of FIG. 2b reflects distance and the y-axis reflects intensity. The x-axis units will depend on factors such as the capabilities of the scanner/lithography tool being used and the feature sizes of the circuit being patterned. For instance, assuming 22 nm or 32 nm node process technologies, the distance on the x-axis measured in nanometers will be smaller fractions of light source wavelength, $\lambda$. The intensity is typically unitless, but can be any suitable measurement of intensity available on a given scanner/tool. The peaks and valleys shown on the plot of FIG. 2b may correspond, for instance, to resist spaces and lines, respectively. The dashed line below resist line L3 shows the intensity plot trend that would be observed at nominal process conditions and predicts a proper image. At lower z-depth and off-focus conditions, however, the image inversion occurs as previously explained. The plot also shows the printing threshold (resist threshold). As is known, the patterned resist material is sensitive to the intensity of impinging light. In some cases, for instance, if the intensity of the light is above the printing threshold of the resist, then the feature depicted by that illuminated portion of the resist pattern will be printed.

Mask with SPAF

At smaller technology nodes (e.g., such as the 22 nm technology node and below), the $K_1$ factor is very close to the theoretical limit even with state-of-the-art scanner and resist technologies. As previously explained, weak aerial image and image inversion phenomena observed in geometric combinations cannot be simply design ruled out. The spaces in which image inversion and severe image degradation occur can also be wider than the minimum space size. These spaces in which image inversion and significant image degradation occur can be, for example, greater than 1.5× of the minimum spacing and the failure mode depends on the local geometric arrangement.

Figure 3:
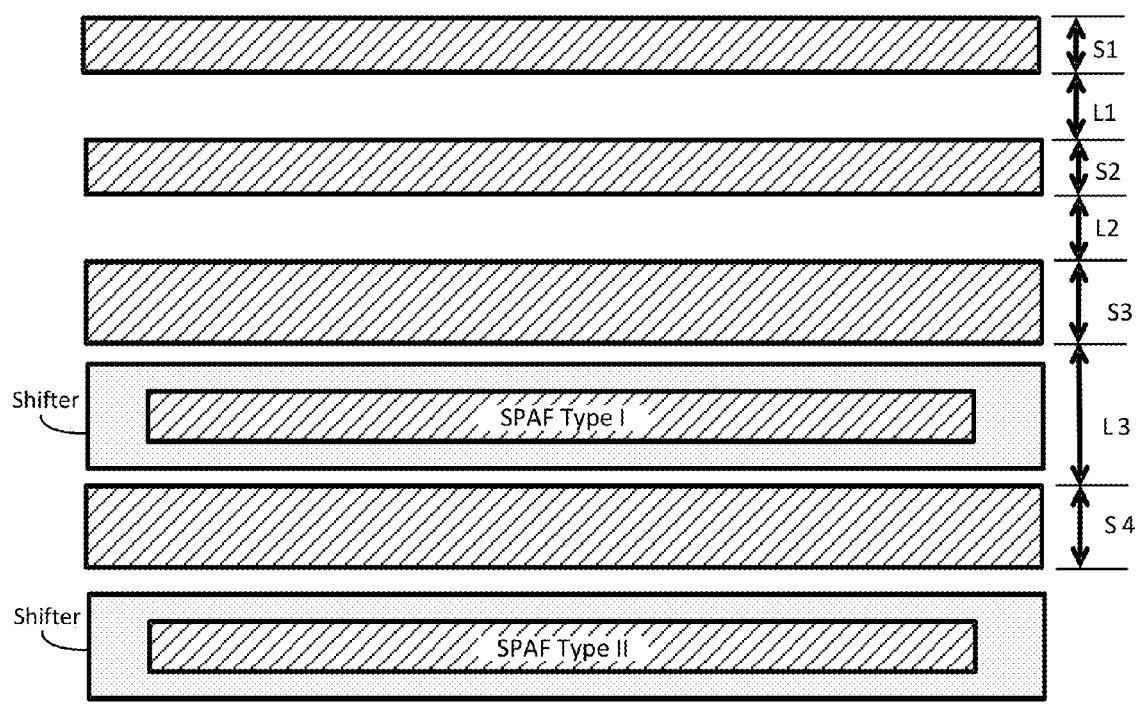
FIG. 3 schematically illustrates a mask configured with two types of sub-resolution phased assist features (SPAFs), in accordance with an example embodiment of the present invention.

To address such issues, and in accordance with one example embodiment of the present invention, SPAFs of pi-phase are synthesized in the weak and inverted image drawn spaces of the mask. FIG. 3 illustrates a mask having first SPAF of type I (between resist spaces S3 and S4) and a second SPAF of type II (after resist space S4), each of which will be discussed in turn. In characterizing resist lines and spaces susceptible to image inversion, measurements (e.g., made with SEM or other suitable measurement equipment) of all fallen resist lines as well as those resist lines that were at the onset of failure were collected and used to develop a model that predicts the onset of failure. The collected measurements were taken at a z-depth lower than nominal z-depth and with a consistent set of process parameters/conditions in place (e.g., same dimension range, same aperture and optic system, etc). The measurements collected included, for instance, intensity, feature size (e.g., line width), and the size of spacing adjacent the feature. The resulting model was used to generate plots that show image inversion. Note that plots of the same locations at a nominal z-depth do not capture the failure mode, and a model developed at the nominal z-depth would suggest a robust process and therefore the failure mode would go uncorrected during optical proximity correction. Intensity analysis (e.g., using SEM or other suitable technology) can be used to confirm or otherwise determine predicted aerial image contrast as well as degree of inversion for any one given layout.

To account for any overlay margins as well as mechanical integrity of the chrome structures (or other opaque material structures) that will remain after etching out the pi-phase at mask making, a shifter (a buffer zone about the SPAF, as shown) of size equivalent to the empirically determined overlay margin is synthesized. In some specific such embodiments, line end compensation adjustment can be included as the shifter pullback can be larger at the line ends. This larger pullback also protects against the mask inspection constraints that are generally closer to their limits in regions with high two-dimensional content. The shifter is designed so as not to result in phase contamination with the main features as the pi-phase is, at mask making step, a boolean AND operation of the sub-resolution assist feature and the shifter geometry. The size and number of the SPAF can be optimized for maximum contrast and process window. This optimization step is iterative and depends, for example, on factors such as the optical source and the resist chemistry.

In more detail and with further reference to the example mask schematic shown in FIG. 3, the space that exhibited image inversion as shown in FIGS. 2a-b is labeled L3. Recall from the previous discussion that resist line L3 fell into resist space S3. As will be appreciated in light of this disclosure, elimination of the secondary peak (local maxima or inverted image) shown in FIG. 2b can be achieved by destructive interference. The SPAF type I in this example mask is thus pi-phase if the main feature is 0-phase (meaning that the phase of light through the SPAF is 180° out-of-phase with the phase of light through the main feature). Because the pi-phase region in this example has 100% transmittance, the SPAF type I is drawn in the same polarity as the main feature (shown with cross-hatching). As will be appreciated in light this disclosure, the actual phase of the SPAF may be fine-tuned to effect a desired change in the corresponding predicted feature critical dimension. As such, the reference herein to pi-phase or 180° out-of-phase is not intended to require a precise phase (i.e., a precise 180° is not required); rather, such reference to pi-phase or 180° out-of-phase is intended to cover a reasonable phase range (e.g., 180°+/−25° or 180°+/−20° or 180°+/−15° 180°+/−10° or 180°+/−5°). In some cases, a precise 180° does not need to be included in the range, and the phase range can be less than 180° or greater than 180°. For example, in some embodiments the phase range can be greater than 145° and less than 180°; greater than 155° and less than 180°; greater than 180° and less than 195°; greater than 180° and less than 205°; or greater than 180° and less than 215°. In other embodiments, the phase range can be greater than or equal to 145° and less than or equal to 177.5°; greater than or equal to 145° and less than or equal to 179°; greater than or equal to 145° and less than or equal to 179.9°; greater than or equal to 182.5° and less than or equal to 215'; greater than or equal to 181° and less than or equal to 215'; or greater than or equal to 180.1° and less than or equal to 215°. Numerous such variations will be apparent in light of this disclosure.

During mask making, and in accordance with one example embodiment, the first level patterning shows the main feature lines and the SPAF type 1 all at 0-phase. Continuing with this example case, an additional layer (i.e., the shifter layer) is employed to indicate that any part of, or all of the 0-phase structure that overlaps with the shifter is to be etched to pi-phase. In some embodiments, the shifter can have the same dimensions as the SPAF type 1 (or only slightly larger, such as 1% to 5% larger). However, mask processes susceptible to errors due to registration shift (e.g., such as cases where the etching of shifter is an intermediate step in a multistep mask process) can result in there being just a partial overlap and therefore only a portion of the SPAF etched to pi-phase. To avoid this, the shifter of the SPAF type 1 is generally drawn larger than the SPAF with the excess dimensions (overlay margin) matching the worst case observed registration shift, in accordance with some embodiments. In such cases, note that the shifter should not get too close to a neighboring main feature as registration shift of the enlarged shifter could result in etching the part of that main feature with which it inadvertently overlaps.

Figure 4A:
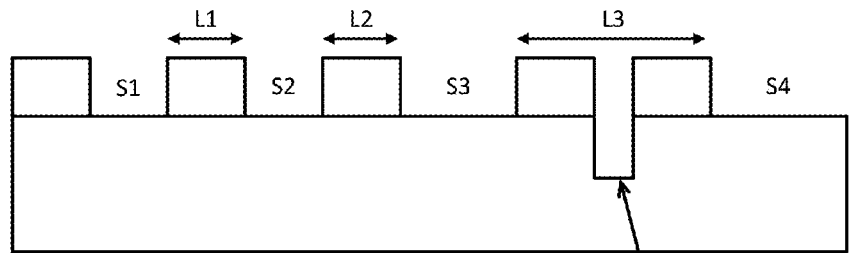
FIG. 4a illustrates a side-view cross-section of an example mask configured in accordance with an embodiment of the present invention, and FIG. 4b schematically illustrates a top view of the mask.
Figure 4B:
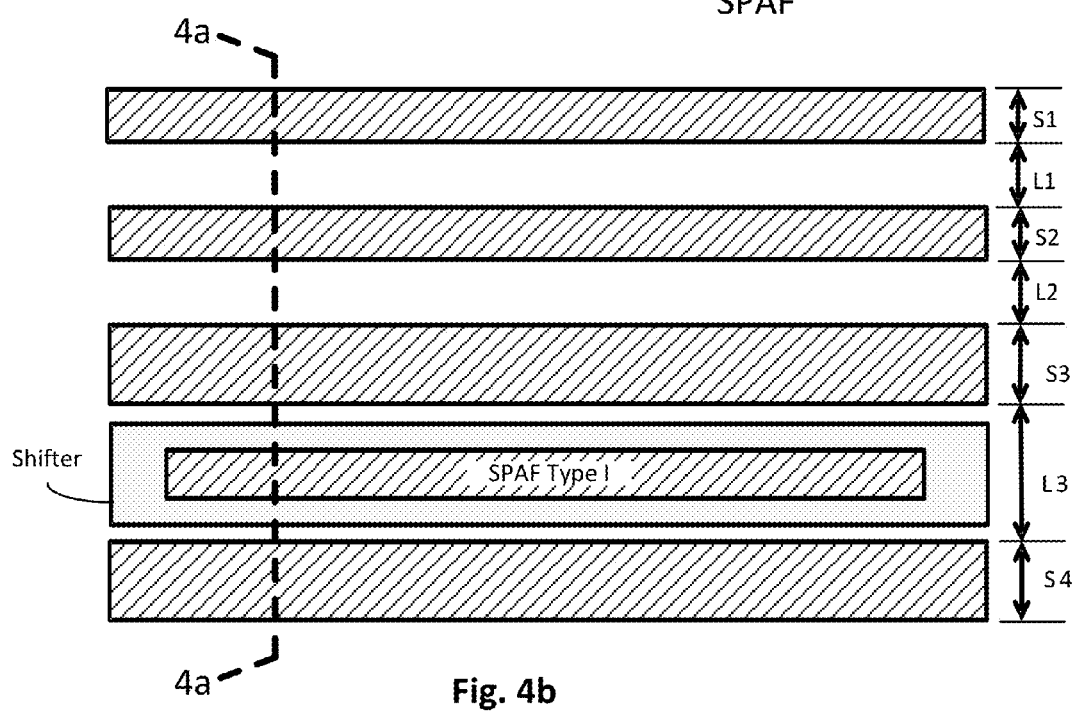

A top view of an example mask configured with an SPAF type 1 in accordance with an embodiment of the present invention is shown in FIG. 4b. A cross-section of this example mask taken from along the dashed line 4a-4a is shown in FIG. 4a. As can be seen, the resist lines include L1-L3. Note that in this example case, L3 is generally larger than L1 and L2. As previously discussed with reference to FIGS. 2a-b, this pitch change from L2 to L3 can cause an inverted image condition. However, an SPAF type 1 feature configured with a shifter to compensate for registration shift during the mask making process is provided in the mask to mitigate the inversion. Note that the SPAF (with or without the shifter) is out-of-phase with the spaces S1 through S4.

The resulting mask thus includes a resist line L3 that is bifurcated or otherwise divided by the final etched SPAF. The etch depth associated with the SPAF can vary depending on the desired phase shift through that portion of the mask. In some embodiments, the etch depth is set to phase shift the light passing through that transmissive portion of the mask so that the light is 180° out-of-phase with the adjacent transmissive portions of the mask that make up S3 and S4. However, as will be appreciated in light of this disclosure, the etch depth can be optimized, as will be discussed in turn. Further note that, in this example embodiment, the SPAF at resist line L3 is drawn in the same polarity as the main features (S1-S4). In addition, note that the ends of the SPAF are shorter than the main features to provide line end compensation adjustment for shifter pullback, in accordance with one such embodiment.

The resist lines of the mask can be implemented, for example, with chrome or any other suitable non-transmissive or partially transmissive material (e.g., aluminum, molybdenum silicide, silicon nitride, titanium nitride, and/or other materials having a desired degree of opacity). The resist spaces of the mask can be implemented, for example, with quartz or any other suitable transmissive or partially transmissive material (e.g., glass, silicon, silicon nitride or oxynitride, boron nitride and/or other transmissive materials). Any number of suitable mask materials having the desired transmissive and/or partially transmissive qualities can be used, and the claimed invention is not intended to be limited to any particular type or configuration of materials. Thus, while chrome on quartz configurations are typical, others will be apparent. Further note that a damaged mask can be repaired, such as depositing carbon or other suitable material to repair clear/transmissive region defects or depositing chrome or other suitable material to repair opaque defects. In addition, note that a mask configured with main features and one or more SPAFs may also include other assist features (e.g., SRAFs), in accordance with some embodiments.

With respect to SPAF type II, the previous discussion with reference to type I is equally applicable here, particularly with respect to marginality concerns associated with large spaces adjacent to narrow lines. SPAFs of type II can be placed in spaces much larger than those observed to exhibit image inversion. As previously explained, a typical mitigation approach for loss of focus window is to selectively place SRAFs that are of the same phase and polarity as the main feature. However, at the dimensions being patterned, for instance, in the sub-32 nm technology nodes, every SRAF included in a mask will be resolved by the process that is used to resolve the main features. In contrast, SPAF type 2 allows the focus window enhancement for narrow features to be achieved at larger pitches without the risk of resolving the sub-resolution phased assist feature on the wafer. In one specific such embodiment, each of the main features has a width, and the SPAF type 2 is associated with a main feature having a width that is larger than the width of the other main features.

Figure 5A:
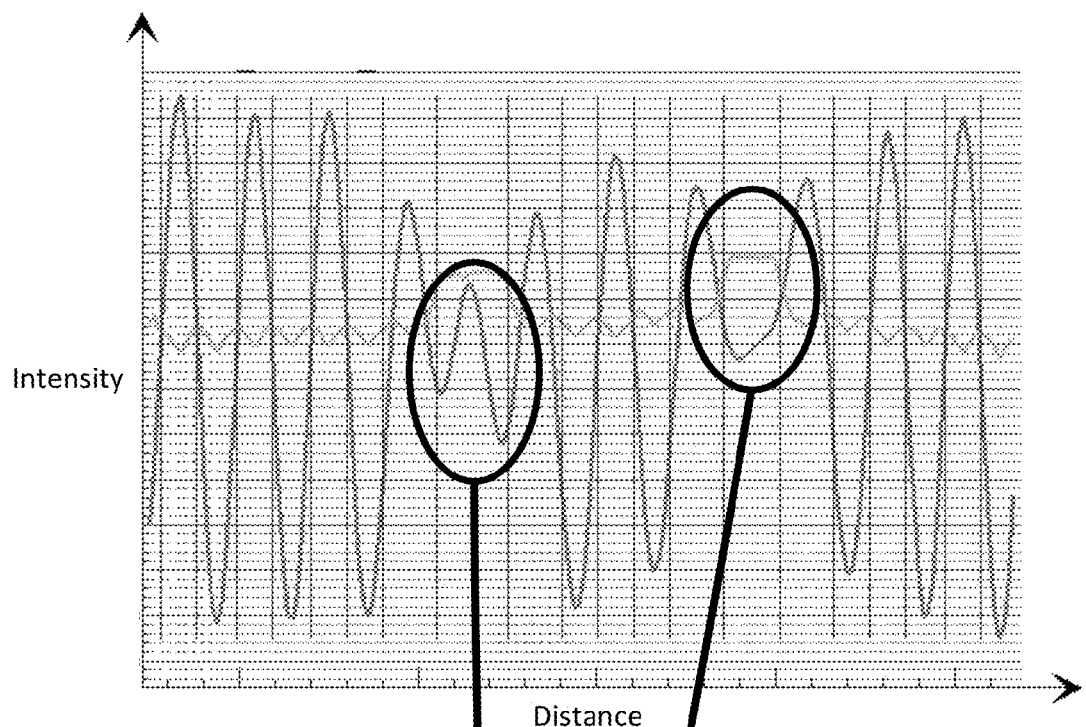
FIG. 5a shows an intensity plot of another conventional mask.
Figure 5B:
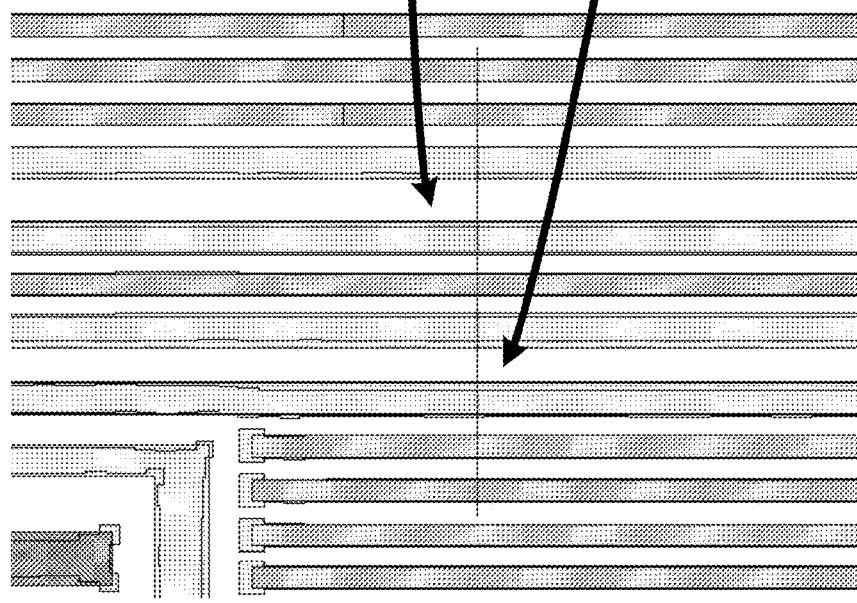
FIG. 5b shows the corresponding mask pattern.
Figure 6A:
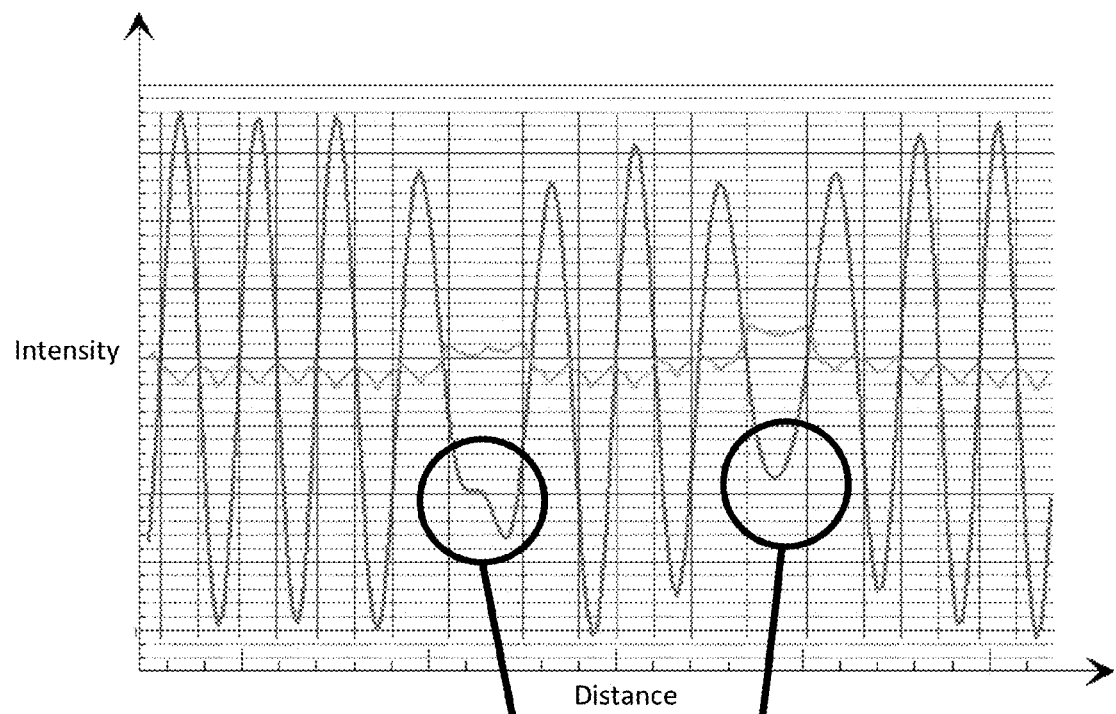
FIG. 6a shows an intensity plot for the same mask used in FIGS. 5a-b, except for the addition of SPAFs configured in accordance with an embodiment of the present invention.
Figure 6B:
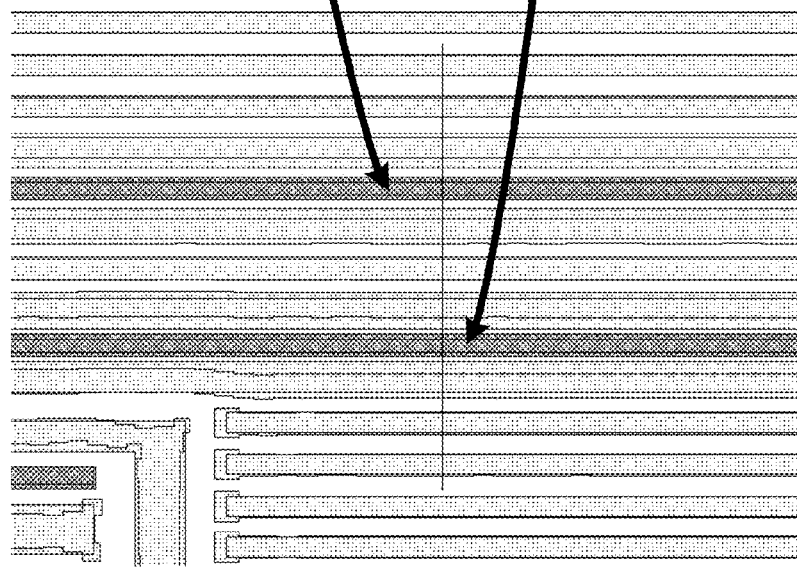
FIG. 6b shows the corresponding mask pattern.

FIG. 5a shows another intensity plot when no SPAF is used and FIG. 5b shows the corresponding mask pattern (as shown by the arrows from FIG. 5a). FIG. 6a shows an intensity plot for the same mask used in FIGS. 5a-b, except for the addition an SPAF configured in accordance with an embodiment of the present invention. As can be seen, the plot of FIG. 6a shows improvement on the minima and removal of the local maxima. FIG. 6b shows the corresponding mask pattern with an appropriately inserted SPAF (as shown by the arrows from FIG. 6a).

Phase Tuning SPAF for EPE Control

As previously explained, RET and OPC can be used to ensure high pattern fidelity on the wafer. As is known, OPC is the technique of intentionally distorting or otherwise modifying mask features to ensure that target features print as desired. A typical OPC flow generally includes contour generation followed by optimization to reduce the geometric error between the resist contour and target feature, where the contour identifies the predicted edge position as it will appear on wafer. The geometric error can be measured as the edge placement error (EPE), which is the distance between the contour and the target feature edge. If the contour position is not exactly on the target edge as drawn in the physical design layout, then the difference is the EPE. In general, if there is an EPE, the contour placement is modulated during correction by adjusting the corrected mask pattern of the main feature. Such OPC-based approaches may not be viable in some geometric combinations due to, for instance, mask manufacturing constraints or high resultant mask error enhancement factor (MEEF). In such cases, phase tuning of the SPAF as described herein can be used.

In more detail, the phase etch depth of a SPAF can be used to control EPE, which in turn provides yield enhancement through process window expansion. As will be appreciated in light of this disclosure, this process window enhancement is achieved without altering the line width beyond what the process specification allows. As previously explained, such line width alterations can have the effect of de-tuning RC characteristics upon which optimal device performance may depend. In addition, no restrictive design rules that often undesirably impact die foot print are required.

Figure 7A:
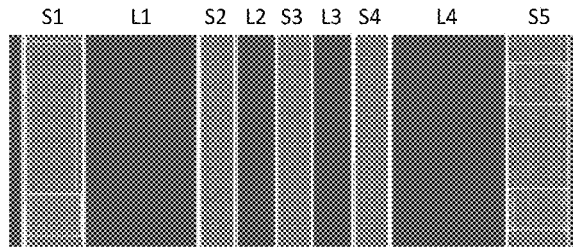
FIG. 7a illustrates contour prediction showing no edge placement error (EPE) for a given target pattern.
Figure 7B:
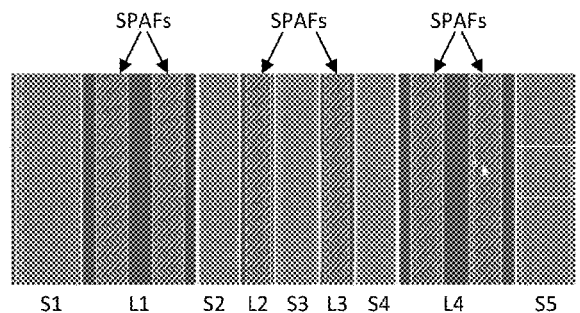
FIG. 7b illustrates the same target pattern but with a number of SPAFs inserted, in accordance with an embodiment of the present invention.
Figure 8A:
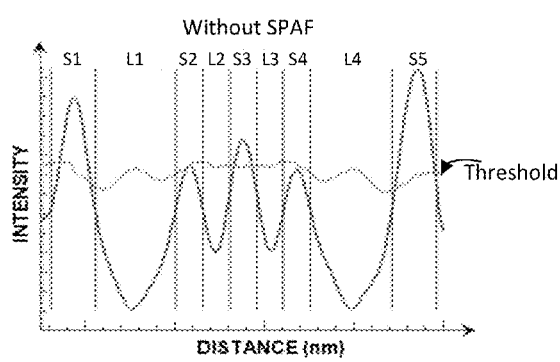
FIG. 8a shows a corresponding aerial image intensity plot of the pattern of FIG. 7a, and FIG. 8b shows the corresponding aerial image of the pattern of FIG. 7b.
Figure 8B:
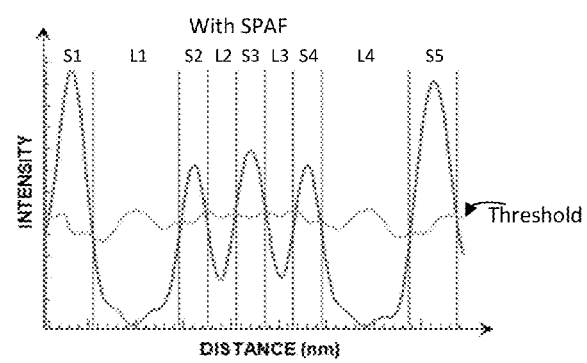

To further explain how SPAF can be used to control EPE, reference is now made to FIGS. 7a-b, 8a-b, and 9a-b. As can be seen, FIG. 7a illustrates contour prediction showing no EPE for a given target pattern, which includes spaces S1 through S5 and lines L1 through L4. FIG. 7b illustrates the same target pattern of FIG. 7a, but with a number of SPAFs inserted with respect to each of the lines L1 through L4 and no change in EPE, in accordance with an embodiment of the present invention. FIG. 8a shows a corresponding aerial image intensity plot of the pattern without SPAF (FIG. 7a). As can be seen, Imax (measure of intensity) is below the desired print threshold for each of spaces S2 and S4 and only marginally above for space S3. FIG. 8b, on the other hand, shows the corresponding aerial image of the same pattern after SPAF insertion (FIG. 7b). In all cases, note that Imax has been improved (e.g., note that Imax for spaces S2 and S4 are above print threshold) without also raising the Imin, thereby demonstrating the SPAF-based improvement in contrast without adjusting target line widths.

To fine tune the effects of SPAF placement in accordance with some embodiments, SPAF width as well as SPAF depth were examined. It was observed that as long as a given SPAF width is maintained below its printing threshold, there is generally no substantial change in contrast of the pattern features as a function of SPAF width, if such width changes are not accompanied by corresponding depth changes. The SPAF etch depth, on the other hand, was observed to have significant effects on contrast. This is primarily due to the change in phase as a function of SPAF etch depth as previously explained herein. In some embodiments, the etch depth of the SPAF is set to phase shift the light passing through that transmissive portion of the mask so that the light is 180° out-of-phase with the adjacent transmissive portions of the mask. As will be appreciated, the etch depth can be optimized so as to make adjustments to or otherwise fine-tune a given predicted critical dimension. Thus, in some example cases, the etch depth of the SPAF may be set to phase shift the light passing through that transmissive portion of the mask so that the light is in the range of 160° to 200° out-of-phase with the adjacent transmissive portions of the mask. In other example cases, the etch depth of the SPAF may be set to phase shift the light passing through that transmissive portion of the mask so that the light is in the range of 165° to 195° out-of-phase with the adjacent transmissive portions of the mask. In other example cases, the etch depth of the SPAF may be set to phase shift the light passing through that transmissive portion of the mask so that the light is in the range of 170° to 190° out-of-phase with the adjacent transmissive portions of the mask. In other example cases, the etch depth of the SPAF may be set to phase shift the light passing through that transmissive portion of the mask so that the light is in the range of 175° to 185° out-of-phase with the adjacent transmissive portions of the mask. In still other example cases, the etch depth of the SPAF may be set to phase shift the light passing through that transmissive portion of the mask so that the light is in the range of 177.5° to 182.5° out-of-phase with the adjacent transmissive portions of the mask. Further note that, depending on the particulars of a given application, the phase tuning range need not be symmetrical about 180°. For instance, in some example cases, the phase difference tuning range is 145° to 185°. In a more general sense, and depending on the nature of the tuning process, any target range of phase difference between the SPAF and main phases may be used for phase tuning as described herein, in accordance with a number of embodiments. The range of acceptable phase difference tuning will vary from one application to the next.

Figure 9A:
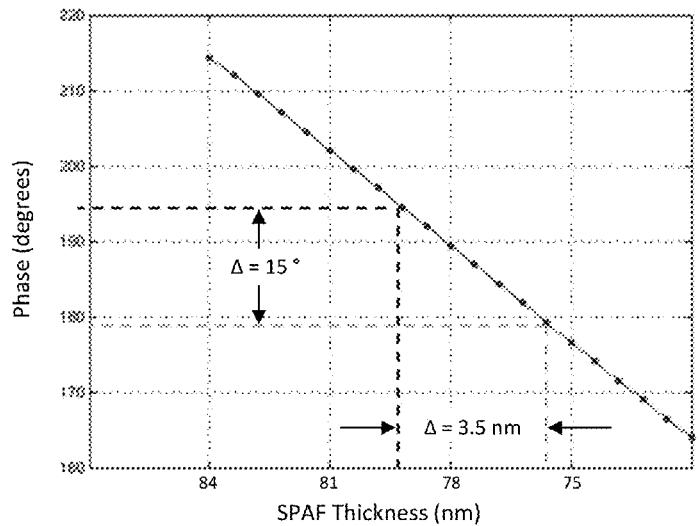
FIG. 9a shows a plot of phase as a function of SPAF etch depth.
Figure 9B:
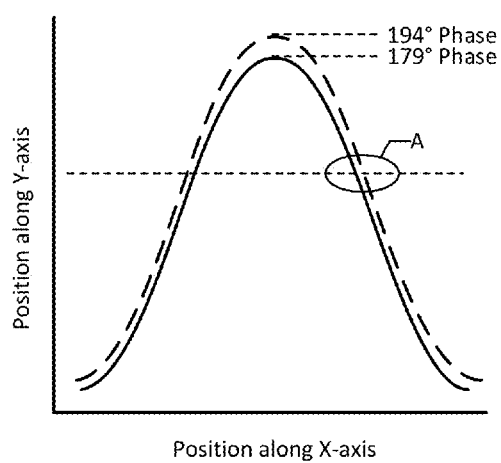
FIG. 9b shows a plot demonstrating the effect of SPAF etch depth on predicted wafer line critical dimension.
Figure 9C:
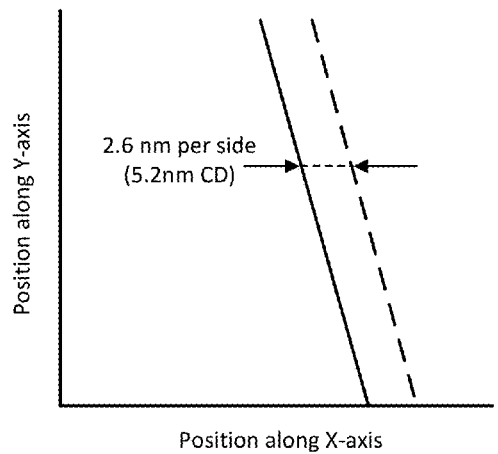
FIG. 9c shows an expanded view of area A of the plot shown in FIG. 9b.

For instance, assume a mask having resist lines implemented with molybdenum silicide and resist spaces implemented with quartz, and a critical dimension (line width) in the range of 80 nm to 135 nm. As can be seen in FIG. 9a, a 3.5 nm change in etch depth of a given SPAF yields about a 15° change in phase shift (from 194° to 179°, in this specific example case). As further shown in FIG. 9b, such a change in the SPAF etch depth also provides a change in the given predicted critical dimension of the wafer line. Specifically, FIGS. 9b-c show that for the example geometries examined (in the range of 80 nm to 135 nm, in some example cases), a critical dimension delta of about 5.2 nm results from an etch depth change of about 15°. As best shown in FIG. 9c, note that the 5.2 nm change in line width results from a 2.6 nm expansion at each side of the line.

As will be apparent, the initial thickness of the SPAF can be set to provide a phase difference (between the main and SPAF features) that is lower than the target phase difference. The SPAF can then be etched (thinned) to bring the phase difference to within a desired tolerance so as to provide, for example, a desired degree of destructive interference and/or a desired predicted feature critical dimension. Any number of such optimizations will be apparent in light of this disclosure. If the SPAF is over etched and the target phase difference range is exceeded (or the target phase difference range cannot be reached by etching the SPAF), note that the relevant main features can be etched to bring the phase difference into the target range, if so desired.

As will be appreciated, the results shown in FIGS. 9a-c are specific to one example embodiment of the present invention, and are not intended to limit the claimed invention. Numerous other configurations and material systems and mask layouts will be apparent in light of this disclosure. In any such cases, a desired change in a predicted critical dimension of a given line or feature can be implemented based on a corresponding change in SPAF etch depth. By so controlling EPE, yield enhancement is effectively enabled through process window expansion. The specific ratio of Δ SPAF etch depth to Δ critical dimension for any given mask system and target application can be determined, for example, based on theoretical modeling and/or empirical study.

Example System

Figure 10:
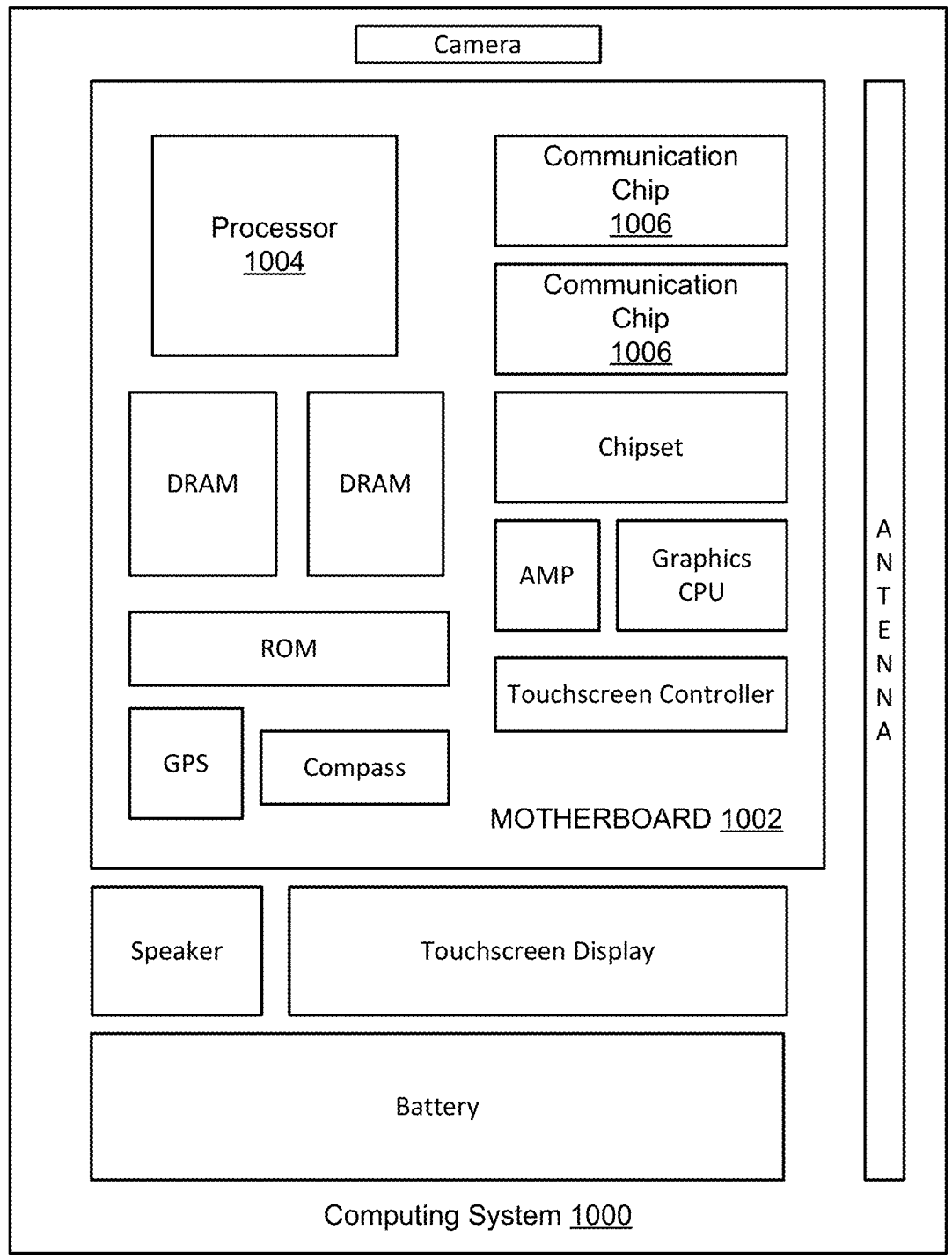
FIG. 10 illustrates a computing system implemented with one or more integrated circuit structures or devices formed using the lithography techniques provided herein, in accordance with an embodiment of the present invention.

FIG. 10 illustrates a computing system 1000 implemented with one or more integrated circuit structures or devices formed using the SPAF-based lithography techniques provided herein, in accordance with an embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, one or more filters (e.g., LC-tank, high-pass, low-pass, bandpass filters), a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 1000 may include one or more integrated circuit structures or features formed using the SPAF-based lithography techniques as described herein. These structures or features can be used, for instance, to implement a transistor, a conductive run, or other circuit including small features. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard circuitry that is implemented with one or more integrated circuit structures or features formed using the SPAF-based lithography techniques as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or features formed using SPAF-based lithography techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs integrated circuit structures or features formed using SPAF-based lithography techniques as described herein.

Thus, the SPAF-based lithography techniques provided herein can be used to enable technology scaling using conventional scanner technologies (e.g., 193 nm), as well as accurate patterning for technology nodes such as 32 nm and 22 nm and below. Some embodiments can be used to provide an indicator for detecting failure before the cost of mask and wafer is incurred. Patterning at small pitches can be achieved without requiring the typical complex design rule constraints and without requiring dual patterning and the associated costs. The mask features can be implemented at sub-resolution, and while they can be used to improve process window and pattern fidelity, they themselves are not printed on the wafer. A mask configured with one or more SPAFs in accordance with an embodiment of the present invention employs destructive interference to resolve image inversion issues and/or significantly improves process window by enhancing contrast in geometric configurations that do not exhibit image inversion. In addition, the SPAF phase etch depth can be optimized so as to make adjustments to a given predicted printed feature critical dimension. Numerous embodiments will be apparent in light of this disclosure.

One example embodiment provides a lithography mask for fabricating semiconductor circuitry. The mask includes a main feature having a phase and a polarity, and a sub-resolution phased assist feature (SPAF) having a polarity that is the same as the main feature and a phase that is 155° to 205° out-of-phase with the phase of the main feature. In some cases, the mask includes a plurality of main features and one or more SPAFs. In some cases, the SPAF is synthesized in a weak non-inverted image drawn space of the mask. In some cases, the SPAF is synthesized in an inverted image drawn space of the mask. In some cases, the SPAF has 100% transmittance. In some cases, the main feature has 100% transmittance. In some cases, the SPAF is configured with an overlay margin to compensate for registration shift during mask formation. In some such cases, the overlay margin does not overlap with the main feature. In some cases, the mask further includes a plurality of resist lines each having a width, wherein the SPAF is associated with a resist line having a width that is larger than the width of the other resist lines. In some such cases, the main feature and the SPAF each comprise quartz or glass and the resist lines comprise chrome or molybdenum silicide. In some cases, the SPAF is shorter than the main feature. In some cases, the mask further includes one or more sub-resolution assist features, each having a phase that is substantially the same as the main feature. In some cases, the phase of the SPAF corresponds to an etch depth of the SPAF. In some cases, the phase of the SPAF is tuned to provide a predicted critical dimension. Numerous variations will be apparent. For example, another embodiment of the present invention provides a lithography system that includes the lithography mask as variously defined in this paragraph.

Another embodiment of the present invention provides a lithography mask for fabricating semiconductor circuits. In this example case, the mask includes a plurality of main features, each having a phase and a polarity. The mask further includes one or more sub-resolution phased assist features (SPAFs), each having a polarity that is the same as the polarity of the main features and a phase that is out-of-phase with the phase of the main features and tuned to provide a predicted critical dimension. The mask further includes a plurality of resist lines. In some cases, each of the one or more SPAFs is synthesized in one of a weak non-inverted image drawn space of the mask or an inverted image drawn space of the mask. In some cases, at least one of the SPAFs is configured with an overlay margin to compensate for registration shift during mask formation, and the overlay margin does not overlap with a neighboring main feature. In some cases, each of the resist lines has a width, and at least one of the SPAFs is associated with a resist line having a width that is larger than the width of the other resist lines. In some cases, each of the main features has a width, and at least one of the SPAFs is associated with a main feature having a width that is larger than the width of the other main features. In some cases, at least one of the SPAFs is shorter than a neighboring main feature. In some cases, the phase of the SPAF is 165° to 195° out-of-phase with the phase of the main features. In some cases, the phase of the SPAF is 170° to 190° out-of-phase with the phase of the main features. In some cases, the phase of the SPAF is 175° to 185° out-of-phase with the phase of the main features.

Another embodiment of the present invention provides a lithography mask for fabricating semiconductor circuits. In this example case, the mask includes a plurality of main features, each having a phase and a polarity. The mask further includes one or more sub-resolution phased assist features (SPAFs). Each SPAF has a polarity that is the same as the polarity of the main features, and a phase that is 155° to 205° out-of-phase with the phase of the main features, and is tuned to provide a predicted critical dimension. In this example case, the mask further includes a plurality of resist lines, wherein each of the resist lines has a width, and at least one of the SPAFs is associated with a resist line having a width that is larger than the width of the other resist lines.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A lithography mask for fabricating semiconductor circuits, comprising:
   a main feature having a phase and a polarity; and
   a sub-resolution phased assist feature (SPAF) having a polarity that is the same as the polarity of the main feature and a phase that is 155° to 205° out-of-phase with the phase of the main feature.

2. The lithography mask of claim 1 wherein the mask includes a plurality of main features and one or more SPAFs.

3. The lithography mask of claim 1 wherein the SPAF is synthesized in a weak non-inverted image drawn space of the mask.

4. The lithography mask of claim 1 wherein the SPAF is synthesized in an inverted image drawn space of the mask.

5. The lithography mask of claim 1 wherein the SPAF has 100% transmittance.

6. The lithography mask of claim 1 wherein the main feature has 100% transmittance.

7. The lithography mask of claim 1 wherein the SPAF is configured with an overlay margin to compensate for registration shift during mask formation.

8. The lithography mask of claim 7 wherein the overlay margin does not overlap with the main feature.

9. The lithography mask of claim 1 further comprising:
   a plurality of resist lines each having a width, wherein the SPAF is associated with a resist line having a width that is larger than the width of the other resist lines.

10. The lithography mask of claim 9 wherein the main feature and the SPAF each comprise quartz or glass and the resist lines comprise chrome or molybdenum silicide.

11. The lithography mask of claim 1 wherein the SPAF is shorter than the main feature.

12. The lithography mask of claim 1 further comprising:
    one or more sub-resolution assist features, each having a phase that is substantially the same as the main feature.

13. The lithography mask of claim 1 wherein the phase of the SPAF corresponds to an etch depth of the SPAF.

14. The lithography mask of claim 1 wherein the phase of the SPAF is tuned to provide a predicted critical dimension.

15. A lithography system comprising the lithography mask of claim 1.

16. A lithography mask for fabricating semiconductor circuits, comprising:
    a plurality of main features, each having a phase and a polarity;
    one or more sub-resolution phased assist features (SPAFs), each having a polarity that is the same as the polarity of the main features and a phase that is out-of-phase with the phase of the main features and tuned to provide a predicted critical dimension; and
    a plurality of resist lines.

17. The lithography mask of claim 16 wherein each of the one or more SPAFs is synthesized in one of a weak non-inverted image drawn space of the mask or an inverted image drawn space of the mask.

18. The lithography mask of claim 16 wherein at least one of the SPAFs is configured with an overlay margin to compensate for registration shift during mask formation, and the overlay margin does not overlap with a neighboring main feature.

19. The lithography mask of claim 16 wherein each of the resist lines has a width, and at least one of the SPAFs is associated with a resist line having a width that is larger than the width of the other resist lines.

20. The lithography mask of claim 16 wherein each of the main features has a width, and at least one of the SPAFs is associated with a main feature having a width that is larger than the width of the other main features.

21. The lithography mask of claim 16 wherein at least one of the SPAFs is shorter than a neighboring main feature.

22. The lithography mask of claim 16 wherein the phase of the SPAF is 165° to 195° out-of-phase with the phase of the main features.

23. The lithography mask of claim 16 wherein the phase of the SPAF is 170° to 190° out-of-phase with the phase of the main features.

24. The lithography mask of claim 16 wherein the phase of the SPAF is 175° to 185° out-of-phase with the phase of the main features.

25. A lithography mask for fabricating semiconductor circuits, comprising:
   a plurality of main features, each having a phase and a polarity;
   one or more sub-resolution phased assist features (SPAFs), each having a polarity that is the same as the polarity of the main features and a phase that is 155° to 205° out-of-phase with the phase of the main features and is tuned to provide a predicted critical dimension; and
   a plurality of resist lines, wherein each of the resist lines has a width, and at least one of the SPAFs is associated with a resist line having a width that is larger than the width of the other resist lines.

* * * * *